(12) United States Patent
Kundaliya et al.

(10) Patent No.: US 9,206,958 B2
(45) Date of Patent: Dec. 8, 2015

(54) THIN FILM WAVELENGTH CONVERTERS AND METHODS FOR MAKING THE SAME

(71) Applicants: Darshan Kundaliya, Beverly, MA (US); Kailash Mishra, North Chelmsford, MA (US)

(72) Inventors: Darshan Kundaliya, Beverly, MA (US); Kailash Mishra, North Chelmsford, MA (US)

(73) Assignee: OSRAM SYLVANIA Inc., Wilmington, MA (US)

(*) Notice: Subject to any disclaimer, the term of this patent is extended or adjusted under 35 U.S.C. 154(b) by 60 days.

(21) Appl. No.: 14/027,507

(22) Filed: Sep. 16, 2013

(65) Prior Publication Data

US 2015/0078010 A1 Mar. 19, 2015

(51) Int. Cl.
F21V 9/08 (2006.01)
G02F 1/355 (2006.01)
G02F 1/35 (2006.01)
H05B 33/26 (2006.01)
H01L 33/50 (2010.01)

(52) U.S. Cl.
CPC . *F21V 9/08* (2013.01); *G02F 1/353* (2013.01); *G02F 1/3555* (2013.01); *H05B 33/26* (2013.01); *H01L 33/504* (2013.01); *H01L 2933/0041* (2013.01)

(58) Field of Classification Search
CPC .................................. F21V 9/08; G02F 1/353
See application file for complete search history.

(56) References Cited

U.S. PATENT DOCUMENTS

| | | | |
|---|---|---|---|
| 5,582,703 A | 12/1996 | Sluzky et al. | |
| 6,864,110 B2 | 3/2005 | Summers et al. | |
| 7,733,571 B1* | 6/2010 | Li | 359/630 |
| 8,093,610 B2 | 1/2012 | Wilm et al. | |
| 2004/0173806 A1 | 9/2004 | Chua | |
| 2007/0064751 A1* | 3/2007 | Tokunaga | 372/22 |
| 2007/0096635 A1* | 5/2007 | Fan et al. | 313/503 |
| 2007/0158668 A1 | 7/2007 | Tarsa et al. | |
| 2008/0173884 A1 | 7/2008 | Chitnis et al. | |
| 2008/0211386 A1* | 9/2008 | Choi et al. | 313/503 |
| 2009/0147497 A1* | 6/2009 | Nada | 362/84 |
| 2009/0167151 A1* | 7/2009 | Kolodin et al. | 313/503 |
| 2011/0227108 A1* | 9/2011 | Tetz et al. | 257/98 |
| 2013/0187122 A1 | 7/2013 | Lee et al. | |

(Continued)

FOREIGN PATENT DOCUMENTS

EP 2 270 884 1/2011
WO WO 01/24283 4/2001

(Continued)

OTHER PUBLICATIONS

Grosso et al., A Novel Transparent Electrode Process, IEEE Transactions on Electron Devices, vol. ED-17, No. 12 (1970) 1083-1085.

(Continued)

*Primary Examiner* — Elmito Breval
(74) *Attorney, Agent, or Firm* — Robert F. Clark

(57) ABSTRACT

Thin film wavelength converters and methods for making the same are disclosed. In some embodiments, the thin film converters include a first thin film layer of first wavelength conversion material, a conductive layer, and a second thin film layer of a second wavelength conversion material. In one embodiment, a photoresist mask is applied to the conductive layer to form a pattern of by which the second wavelength conversion material may be applied by electrophoretic deposition to the exposed regions of the surface of the conductive layer.

8 Claims, 11 Drawing Sheets

(56) References Cited

U.S. PATENT DOCUMENTS

2013/0264600 A1* 10/2013 Lee et al. .................. 257/98
2014/0022779 A1* 1/2014 Su et al. .................. 362/231

FOREIGN PATENT DOCUMENTS

WO   WO 2009/014707        1/2009
WO   WO 2013/025264        2/2013

OTHER PUBLICATIONS

Van Tassel et al., Mechanisms of Electrophoretic Deposition, Key Engineering Materials, vol. 314 (2006) 167-174.
Talbot et al., Electrophoretic deposition of monochrome and color phosphor screens for information displays, J. Materials Sci., 39 (2004) 771-778.

* cited by examiner

Chip Level Conversion

Remote Phosphor Conversion

| Substrate 201 |
|---|

FIG. 4A

| First Wavelength Conversion Material 202 |
|---|
| Substrate 201 |

FIG. 4B

| Conductive Layer 203 |
|---|
| First Wavelength Conversion Material 202 |
| Substrate 201 |

FIG. 4C

| Photoresist 401 |
|---|
| Conductive Layer 203 |
| First Wavelength Conversion Material 202 |
| Substrate 201 |

| Conductive Layer 203 |
|---|
| First Phosphor 202 |
| Substrate 201 |

FIG. 4E

| Substrate 201 |
|---|

FIG. 6A

| Substrate 201 |
|---|
| First Wavelength Conversion Material 202 |

FIG. 6B

| Conductive Layer 203 |
|---|
| Substrate 201 |
| First Wavelength Conversion Material 202 |

| Second Wavelength Conversion Material |
|---|
| Conductive Layer 203 |
| Substrate 201 |
| First Wavelength Conversion Material 202 |

FIG. 6D

ABSOLUTE US 9,206,958 B2

THIN FILM WAVELENGTH CONVERTERS AND METHODS FOR MAKING THE SAME

FIELD

The present application relates to thin film wavelength converters and, more particularly, to methods for producing thin film wavelength converting structures.

BACKGROUND

Solid state light sources such as light emitting diodes (LEDs) generate visible or non-visible light in a specific region of the electromagnetic spectrum. An LED may output light, for example, in the blue, red, green or UV region(s) of the electromagnetic spectrum, depending on the material composition of the LED. When it is desired to construct an LED light source that produces light having a color different from that of the output color of the LED, it is achieved by down-converting the emitted radiation ("primary light") from a LED source to radiations having longer wavelength ("secondary light" and "tertiary light" as needed) by a luminescent material via the process of photoluminescence.

Photoluminescence generally involves absorbing higher energy radiation (photons) and emission of radiation at longer wavelengths by a wavelength converting material ("conversion material") such as a phosphor or mixture of phosphors. This process may be referred to as "wavelength conversion." An LED combined with a wavelength converting structure that includes a conversion material such as phosphor to produce secondary or tertiary light may be described as a "phosphor-converted LED" or "wavelength converted LED" light source.

In a known configuration, an LED die such as a III-nitride die is positioned in a reflector cup package. To convert primary light from an LED to secondary light, partially or completely, a wavelength converting material must be included in a design of a light source. This material could be in the form of powder or a self supporting "plate," such as a ceramic or single crystal plate. The plate may be attached directly to the LED die, e.g. by bonding, sintering, gluing, etc. Such configurations may be understood as "chip level conversion" or "CLC." The "chip level conversion" also includes direct deposition of conversion material on the LED chip or deposition of a composite material consisting of particles of conversion materials dispersed in silicone. Alternatively, the plate may be positioned remotely from the LED. Such a configuration may be understood as "remote conversion."

Additionally, it is always desired to utilize wavelength converting materials that can partially or completely convert primary light emitted by an LED to secondary and/or tertiary light to produce light with a desired correlated color temperature. In particular, interest has grown in the production of wavelength converting structures to fabricate "warm white" light sources, i.e., that the light generated by the light source is white and has a color temperature in the range of about 2500-3500K. Although warm white LED lamps have been developed using wavelength converting structures that include one or more phosphor powders dispersed in a polymeric (e.g., silicone) binder, such converters have many disadvantages. For example, powdered phosphor in silicone may impose limitations on the thermal management of an LED lamp, which may negatively impact lamp performance and lifetime.

Thus, there remains a need in the art for wavelength converting structures that can produce secondary and/or tertiary light with desirable optical characteristics, and which may avoid some or all of the limitations of a powdered phosphor in silicone converter.

BRIEF DESCRIPTION OF THE DRAWINGS

Reference is now made to the following detailed description which should be read in conjunction with the following figures:

FIGS. 4A-4G stepwise illustrate another exemplary process for forming an all inorganic wavelength converter consistent with the present disclosure.

FIGS. 6A-6D stepwise illustrate another exemplary process for forming another all inorganic wavelength converter consistent with the present disclosure.

DETAILED DESCRIPTION

Figure 1A:
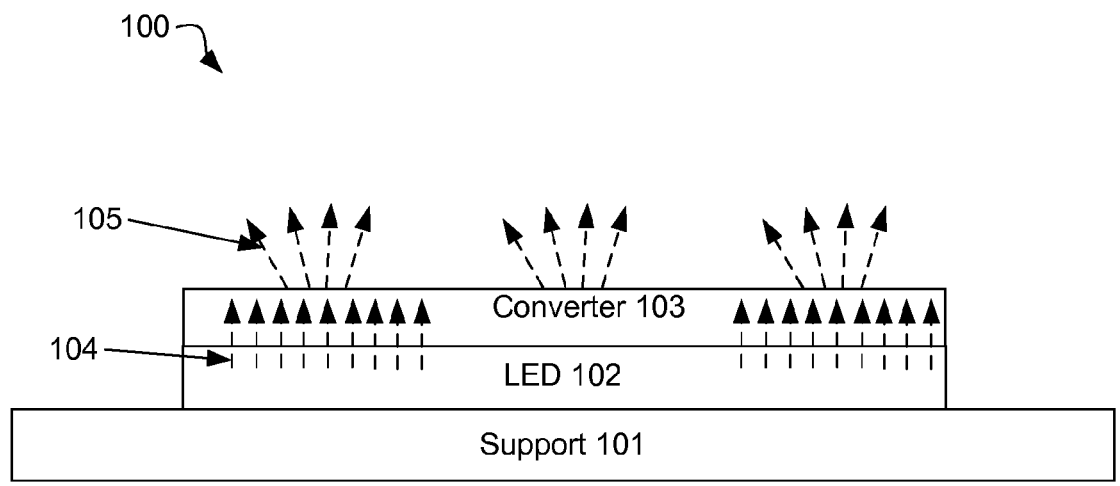
FIGS. 1A and 1B illustrate exemplary light sources including a wavelength converter positioned for chip level conversion or remote conversion, respectively, in accordance with the present disclosure.

As used herein, the terms "about" and "substantially," when used in connection with a numerical value or range, mean+/−5% of the recited numerical value or range.

From time to time, one or more aspects of the present disclosure may be described using a numerical range. Unless otherwise indicated herein, any recited range should be interpreted as including any iterative values between indicated endpoints, as if such iterative values were expressly recited. Such ranges should also be interpreted as including any and all ranges falling within or between such iterative values and/or recited endpoints, as if such ranges were expressly recited herein.

For the sake of the present disclosure, the term "primary light" refers to light emitted by a light emitting diode in a light source.

As used herein, the term "secondary light" means light produced by photoluminescent conversion of primary light by at least one first wavelength conversion material.

The term, "tertiary light" is used herein to mean light produced by photoluminescent conversion of primary and/or secondary light by at least one second wavelength conversion material. In some embodiments the second wavelength conversion material is downstream of the first wavelength conversion material (e.g., as part of layer distal from a source of primary light). Alternatively or additionally, the second wavelength conversion material may be homogeneously or heterogeneously mixed with (or otherwise distributed within)

the first wavelength conversion material, or a combination thereof. (Higher order conversion material such as quaternary wavelength material may be defined in a similar manner. Secondary wavelength conversion material may be combination of two different red-emitting materials or red/orange-emitting materials.

The term, "output light" is used herein to mean light that is output from a lamp referred to as a light source, e.g., light that is emitted from a lamp in a region distal to a wavelength converters Output light may include primary light, secondary light, tertiary light, combinations thereof, and the like. Without limitation, output light consistent with the present disclosure preferably has a color temperature ranging from about 2000K to about 4500K, such as about 3000K. Of course, output light having other color temperatures may be used and is envisioned by the present disclosure.

References to the color of a phosphor, LED or conversion material refer generally to its emission color unless otherwise specified. Thus, a blue LED emits a blue light, a yellow phosphor emits a yellow light and so on.

One aspect of the present disclosure relates to wavelength converters for solid state light sources. Generally, the wavelength converters of the present disclosure include at least one first conversion material for converting primary light emitted by a solid state light source to secondary light. In addition, the wavelength converters described herein include at least one second conversion material for converting at least a portion of unconverted primary light and/or secondary light from the first conversion material to tertiary light.

As may be appreciated, tertiary light produced by a second phosphor material will (by definition) have different spectral characteristics than secondary light produced by a first phosphor material. Thus, the color temperature of the output light from a lamp may be adjusted by controlling the type or characteristics and relative concentration of the first and/or second phosphors. For example, if the characteristics of a first phosphor material are held constant, control over the correlated color temperature of the output light from a lamp may be achieved by adjusting the type, characteristics and/or the concentration of the second conversion material Although any type of wavelength converter may be used in accordance with the present disclosure, in non-limiting preferred embodiments the wavelength converters described herein are in the form of a wavelength converting plate that includes one or more layers (e.g., thin-films) of conversion material. For the sake of clarity, a wavelength converter of that type is referred to herein as a "thin film converter." In some embodiments, wavelength converters of the present disclosure are in the form of a thin film converter that includes one or more layers of at least one first wavelength conversion material and one or more layers of at least one second wavelength conversion material.

Figure 1B:
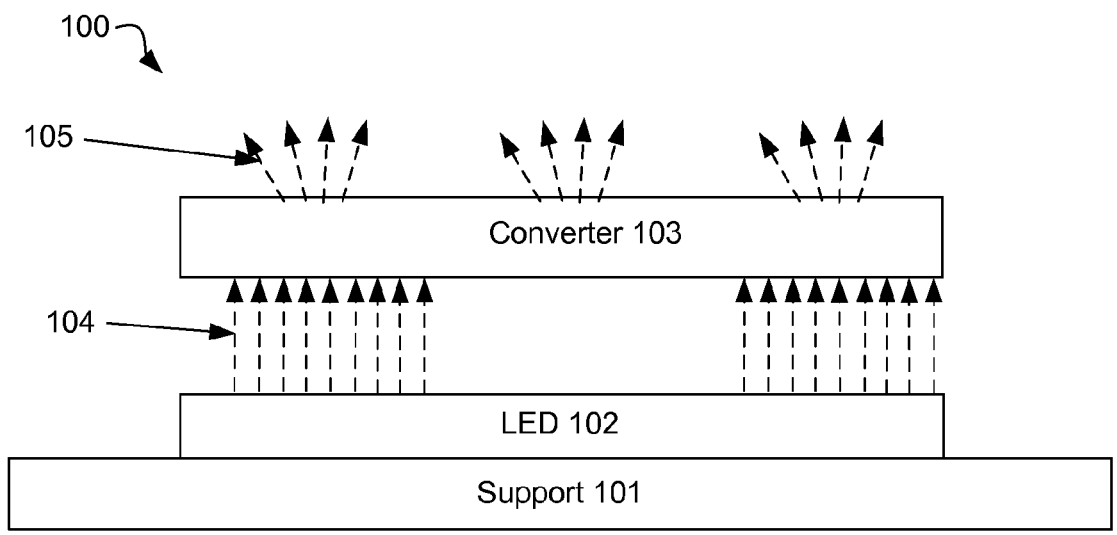

Reference is now made to FIGS. 1A and 1B, which diagrammatically illustrate the structure of two exemplary lamp configurations in accordance with the present disclosure. In FIG. 1A, LED light source 100 includes LED 102, which is present on an upper surface (not labeled) of support 101. LED light source 100 further includes a wavelength converter 103, which in this case is disposed on a light emitting surface (not labeled) of LED 102. For the sake of simplicity and ease of understanding, converter 103 is illustrated in FIGS. 1A and 1B as a single structure. However, as discussed later however, converter 103 includes multiple layers (e.g. thin films) of various materials, including at least one layer of a first conversion material, a conductive layer, and at least one layer of a second conversion material. Because converter 103 abuts a surface of LED 102, LED light source 100 in FIG. 1A may be understood to have a "chip level conversion" (CLC) structure.

As further illustrated in FIG. 1A, at least a portion of primary light 104 emitted from LED 102 may be incident on and absorbed by converter 103. The absorption of primary light 104 may excite first and/or second conversion materials within converter 103 to a higher energy state. When such conversion materials relax to a lower energy state, they may emit secondary and/or tertiary light (not labeled). Output light 105 distal to (i.e., downstream of) converter 103 may be emitted from LED light source 100, and may include a combination of secondary and tertiary light. If all of primary light 104 is not converted by converter 103, output light 105 may also include unconverted primary light. The ratio of primary, secondary, and tertiary light in output light 105 may be determined by the effective conversion efficiency of the conversion materials making up converter 103.

FIG. 1B includes the same elements as FIG. 1A, and thus the nature and function of such elements will not be repeated. Unlike FIG. 1A, however, converter 103 in FIG. 1B is placed some distance away from a light emitting surface of LED 102. Because converter 103 is "remote" from LED 102, FIG. 1B may be understood as depicting an LED light source having a "remote phosphor" configuration.

In the interest of clarity and for ease of understanding, FIGS. 1A and 1B depict the structure of LED light source 100 in simplified form. It should be understood that LED light source 100 may include any number of other components that may be included in a lamp. Such components may include, for example, driving electronics, reflectors, a housing, one or more heat sinks, one or more diffusers, combinations thereof, and the like.

LED 102 has been illustrated in FIGS. 1A and 1B as a single structure for the purpose of clarity. Although this configuration is useful, it should be understood that LED 102 may include multiple LEDs that can be arranged in a pattern or an array. Such structures are referred to herein as an "LED kernel." The number and distribution of LEDs in an LED kernel may vary widely. For example, the LED kernels described herein may include from greater than 1 to about 100 LEDs or more. In some embodiments, the LED kernels include from about 2 to about 75 LEDs, about 3 to about 50 LEDs, about 4 to about 30 LEDs, about 5 to about 25 LEDs, or even about 10 to about 20 LEDs. Of course, LED kernels with any number of LEDs are envisioned by the present disclosure, and may be used in accordance with the light sources described herein.

LED 102 (or a corresponding LED kernel) may be any known LED, including but not limited to a III-V nitride LED such as an InGaN LED. LED 102 is a source of primary light. In some embodiments, LED 102 is a LED kernel that includes one or more blue LEDs, i.e., LEDs that emit primary light in the blue portion of the visible region of the electromagnetic spectrum (e.g., from about 450 to about 500 nm). Of course, LEDs emitting in other regions of the electromagnetic spectrum may also be used. For example, LED 102 may in some embodiments be an LED kernel including a combination of blue and red LEDs.

With the foregoing in mind, one aspect of the present disclosure relates to thin film converters that include multiple layers of wavelength conversion materials. In particular, one aspect of the present disclosure relates to thin film converters that include at least one layer of at least one first wavelength conversion material and at least one layer of at least one second wavelength conversion material. Without limitation, the layers of first and second wavelength conversion materials are preferably in the form one or more all inorganic thin films.

As will be described in detail below, the layers of first and second wavelength conversion materials may provide desirable conversion characteristics for primary and/or secondary light, while mitigating or avoiding some or all of the limitations of phosphor powder and/or ceramic phosphor embedded in silicone. In particular, the wavelength conversion materials may be selected and/or deposited such that they have wavelength conversion characteristics so as to enable a light source to produce output light having desirable optical properties.

In some embodiments, exemplary wavelength converters consistent with the present disclosure may convert primary light having first spectral characteristics to secondary and tertiary light having second and third spectral characteristics, respectively, to result in the production of output light having a desired fourth spectral characteristic. For example, the first wavelength converting materials described herein may be configured to convert primary light having a first wavelength distribution (e.g., blue light in the range of about 450 to about 500 nm) to secondary light having a second wavelength distribution (e.g., light in the range of 450-700 nm). Moreover, the second wavelength converting materials may be configured to convert primary and/or secondary light to tertiary light having a third wavelength distribution (e.g., green, orange, amber, yellow, and/or red light in the range of about 600 to about 760 nm). Of course, such wavelength ranges are exemplary only, and any suitable wavelength ranges may be used. Indeed as will be described below, the optical characteristics of the at least one first and second wavelength converting layers may be adjusted in various ways, such as by controlling their composition, thickness, the manner in which they are deposited, and combinations thereof.

The thin film converters of the present disclosure may optionally include a substrate. If used, the substrate may perform the function of supporting one or more layers of conversion materials thereon. In this regard, the substrates described herein may be capable of supporting one or more layers of wavelength converting and/or other materials on their surface(s). In some embodiments, substrates consistent with the present disclosure are generally planar, and have first (upper) and second (lower) surfaces, either of which may support one or more thin films of first and/or second wavelength conversion materials.

Any suitable materials may be used to form the substrates described herein. As non-limiting examples of suitable substrate materials, mention is made of single crystals or polycrystalline materials formed into a rigid plate structure using known ceramic, thin film deposition or crystal growth methods. Non-limiting examples of useful single crystal substrate materials include phosphor ceramics such as YAG:Ce (cerium doped yttrium aluminum garnet) (100), LuAG:Ce (cerium doped lutetium aluminum garnet), sapphires such as c-sapphire (0001) and r-sapphire ($\overline{1}102$), gallium nitride, aluminum gallium nitride (AlGaN), and indium gallium nitride (InGaN). Non-limiting examples of useful polycrystalline substrate materials include YAG, rare earth doped YAG, rare earth doped LuAG, nitride phosphors ceramics such as $M_2Si_5N_8:Eu^{2+}$, wherein M=Ca, Sr, Ba, oxynitride phosphor ceramics such as $MSi_2O_2N_2:Eu^{2+}$, wherein M=Ca, Sr, Ba, transparent alumina ($Al_2O_3$), phosphor ceramics, aluminum nitride (AlN), yttria stabilized zirconia (YSZ), zirconium oxides, gallium nitride, aluminum gallium nitride (AlGaN), and indium gallium nitride (InGaN). Of course such materials are exemplary only, and the substrates described herein may be formed on other monocrystalline or polycrystalline materials (e.g., GaN, quartz, silicate phosphor ceramic, etc.), as may be known to those skilled in the art.

As noted previously, the wavelength converters described herein need not include a substrate such as those described above. Indeed in some embodiments, the surface of a light emitting diode may serve as a substrate for the wavelength conversion layers described herein. Alternatively or additionally, one or more layers of a first and/or second wavelength conversion material may be used as a substrate upon which other conversion layers and/or conductive layers may be deposited. Without limitation, in some embodiments one or more layers of first wavelength conversion materials are preferably used as a substrate for the subsequent deposition of additional layers of first wavelength conversion materials, conductive material, and/or second wavelength conversion materials.

In some embodiments, the thin film wavelength converters of the present disclosure include a substrate that it is capable of withstanding high temperatures that may be used during the deposition and/or post processing of one or more layers of first and/or second wavelength conversion materials. In some embodiments for example, the substrates described herein may be capable of withstanding temperatures equal to or in excess of 400° C., 600° C., 800° C., 1000° C., 1100° C., 1200° C., 1300° C., 1400° C., 1500° C., 1600° C., 1700° C., 1800° C., 1900° C., or even 2000° C., to which it may be exposed during the deposition and/or post processing of one or more layers of wavelength conversion material. Such high temperature resistance may be desired in instances where one or more of the thin films deposited on the substrate may be subject to high temperature post processing, such as high temperature annealing. Sapphire and quartz are non-limiting examples of suitable high temperature substrate materials, although other materials with high temperature resistance may also be used.

In further exemplary embodiments, the substrates of the present disclosure may correlate to one or more portions of a lamp and/or a solid state light source such as an LED. For example, the substrates of the present disclosure may be in the form of an LED, as may be useful in chip level conversion configurations. Alternatively or additionally, the substrates of the present disclosure may be in the form of a transparent support coupled to a body (e.g., a reflector body) of a lamp, such that all or a portion of a wavelength converting structure formed thereon may be positioned above a solid state light source, as may be useful in a remote conversion configuration.

The substrates of the present disclosure may also be at least partially transparent to incident primary, secondary, and/or tertiary light. For example, the substrates described herein may be configured to transmit greater than or equal to about 50% of incident primary, secondary, and/or tertiary light. In some embodiments, the substrates described herein may transmit greater than 50% to about 100%, such as greater than or equal to about 60% to about 100%, greater than or equal to about 70% to about 100%, greater than or equal to about 80% to about 100%, greater than or equal to about 90% to about 100%, or even greater than or equal to about 95% to about 100% of incident primary, secondary, and/or tertiary light. Without limitation, the substrates of the present disclosure preferable exhibit such transmission characteristics for each of incident primary, secondary, and tertiary light.

As noted previously, the thin film wavelength converters of the present disclosure may include one or more layers of at least one first wavelength conversion material. In general, the layer(s) of at least one first wavelength conversion material may function to convert all or a portion of primary light from a solid state light source to secondary light. For example, the layer(s) of at least one first wavelength conversion material may in some embodiments be configured to convert primary light in a first wavelength range (e.g., from about 380 to about 500 nm) to secondary light in a second wavelength range (e.g., from about 380 to about 800 nm).

In this regard, any suitable conversion material or combination of conversion materials may be used to form the one or more layers of at least one first conversion material. Exemplary materials that are suitable for use as first wavelength conversion materials include but are not limited to phosphors such as oxide garnet phosphors and oxynitride phosphors. In some embodiments, the first conversion material includes or is formed of one or more phosphors selected from: garnets such as $Y_3Al_5O_{12}:Ce^{3+}$, $Lu_3Al_5O_{12}:Ce^{3+}$, $Tb_3Al_5O_{12}:Ce^{3+}$; nitrides such as $M_2Si_5N_8:Eu^{2+}$, wherein M=Ca, Sr, Ba; oxynitrides such as $MSi_2O_2N_2:Eu^{2+}$, wherein M=Ca, Sr, Ba; silicates such as $BaMgSi_4O_{10}:Eu^{2+}$, $M_2SiO_4:Eu^{2+}$, wherein M=Ca, Ba, Sr; combinations thereof, and the like. Alternatively or additionally, the one or more layer(s) of at least one first conversion material may also include or be formed from one or more of the following materials: $MAlSiN_3:Eu$, wherein M is a metal selected from Ca, Sr, Ba; $A_2O_3:RE^{3+}$ wherein A is selected from Sc, Y, La, Gd, Lu and $RE^{3+}$ is a trivalent rare earth ion such as $Eu^{3+}$; and other tertiary and higher metal oxides doped with divalent or trivalent rare earth ions such as $Eu^{3+}$, $Ce^{3+}$, $Eu^{2+}$, $Tb^{3+}$, etc, including functional groups like molybdates, niobates or tungstates. Of course, other conversion materials that may be known to those of skill in the art may also be used to form the one or more layers of at least one first conversion material. Without limitation, the thin film converters of the present disclosure preferably include at least one layer of $Y_3Al_5O_{12}:Ce^{3+}$ as a first conversion material.

Thickness is one factor that can affect the amount of primary light that may be converted to secondary light by the layer(s) of first conversion material. Accordingly, the layer(s) of first conversion material may have a thickness that is selected to achieve a desired amount of conversion of primary to secondary light. In some embodiments, thickness ranges from about 10 nanometers (nm) to about 20 micrometers (μm), such as about 50 nm to about 20 μm, about 500 nm to about 20 μm, or even about 1 μm to about 5 μm.

The particle size of phosphor(s) in the one or more layers of at least one first wavelength conversion material may also impact the optical properties of such layers. For example, the particle size of phosphors in the one or more layers of at least one first wavelength conversion material may affect the degree to which such layers scatter incident primary, secondary, and/or tertiary light. Without limitation, the phosphors of the one of more layers of at least one wavelength conversion material may be deposited such that such layers do not substantially scatter primary, secondary, and/or tertiary light. That is, such phosphors may be deposited such that the one or more layers of first conversion material scatter less than or equal to about 5% (e.g., ≤2.5%, ≤, 1%, ≤0.5%, or even 0%) of incident primary, secondary, and/or tertiary light. Put in other terms, the phosphors of the one or more layers may be deposited such that they have a particle size that does not substantially impede forward propagation of primary light, secondary light, or a combination thereof into a subsequent layer of conversion material.

Accordingly, the phosphor(s) in the layer(s) of first conversion material in the thin film converters of the present disclosure may have a particle size distribution that is selected to achieve desired optical properties, such as but not limited to a desired degree of scattering. In some embodiments, the phosphor(s) included in the layer(s) of first conversion material have a particle size distribution ranging from about 100 nm to about 8 μm, such as about 100 nm to about 1 μm, about 100 nm to about 700 nm, about 100 nm to about 500 nm, or even about 100 to about 450 nm. Without limitation, the particle size of the phosphor(s) of the layer(s) of first conversion material is preferably less than or equal to the wavelength of incident primary light, e.g., to reduce scattering of incident primary light. Thus, if incident primary light is in a wavelength range of about 450 nm to 500 nm, the particle size of the phosphor(s) of the layer(s) of first conversion material is preferably less than or equal to about 450 nm, such as about 100 to about 400 nm.

The layer(s) of at least one first conversion material may be deposited or otherwise formed on a substrate or other support in any suitable manner. For example, the layer(s) of at least one first conversion material may be deposited using a first deposition process, such as but not limited to physical vapor deposition, chemical vapor deposition, sputtering, pulsed laser deposition, electrophoretic deposition or any another deposition technique. Without limitation, the one or more layers of at least one first conversion material are formed by pulsed laser deposition (PLD). As may be appreciated, PLD may be capable of depositing thin films of highly stoichiometric materials of complex phosphor composition wherein each layer has a controlled thickness, e.g., of about 20 μm or some other desired thickness. Of course, deposition of the first conversion material by PLD is not required. Indeed in other exemplary preferred embodiments, the layer(s) of first conversion materials may be deposited using electrophoretic deposition, e.g., on a luminescent substrate or other substrate.

Subsequent to deposition, the layer(s) of at least one first conversion material may be subject to post processing, including but not limited to thermal post processing such as annealing. For example, the layer(s) of at least one first conversion material may be annealed, e.g. to encourage grain growth or for another purpose. Without limitation, the layer(s) of first conversion material is/are preferably annealed after deposition at a temperature ranging from about 400° C. to about 2000° C., such as about 600° C. to about 2000° C., about 800° C. to about 2000° C., about 1000° C. to about 1900° C., about 1200° C. to about 1800° C., or even about 1400° C. to about 1700° C. In some embodiments, the layer(s) of first conversion material(s) are annealed at about 1600° C. Annealing may occur in air or in another environment, such as in an inert gas environment (e.g., Helium, Neon, and Argon) in a vacuum, in an oxygen environment, in nitrogen environment or in a forming gas environment (e.g., 1-10% hydrogen, balance nitrogen).

In some embodiments, the layer(s) of at least one first conversion material may be processed into a pattern or other structure after deposition. For example, the layer(s) of at least one first conversion material may be processed into a plurality of phosphor "islands," which may be in contact with a surface of a substrate or one or more under layers on the surface of a substrate. In this way, a layer of first conversion material may be processed into "pixels" (e.g., three dimensional islands having a height, width, and gap spacing), upon which other layers/materials may be deposited. Such processing may be performed for example by subjecting a deposited layer of at least one first conversion material to an etching process, such as but not limited to photolithography.

In instances where photochemical etching is used, a photoresist mask may be deposited (e.g., by spin coating) on a layer of at least one first conversion material. All or a portion of the photoresist mask may be exposed to light, so as to form an exposed pattern within the mask. Depending on the mask, the exposed or unexposed portions of the photoresist may then be removed using a developing solution as known in the art, thus exposing portions of the layer of first wavelength conversion material(s) while others remain protected by the photoresist mask. The resultant structure may then be subject to a wet or dry etching agent, which may remove portions of the first wavelength conversion material(s) in regions that are unprotected by the photoresist mask. The photoresist mask may then be removed (e.g., with a stripping solution) or retained, after which the structure may be further processed as discussed below.

The thin film wavelength converters of the present disclosure may also include one or more layers of at least one second wavelength conversion material. As noted previously, the layer(s) of at least one second wavelength conversion material may function to convert all or a portion of incident primary (e.g., unconverted primary light from a solid state light source) and/or secondary light emitted by the layer(s) of at least one first wavelength conversion material to tertiary light. The tertiary light may include light in a different wavelength range than the primary and secondary light. Alternatively or additionally, the tertiary light may include light in a wavelength range encompassed by the second wavelength range of the secondary light, but at different (e.g., higher) concentration than the secondary light produced by the layer(s) of first wavelength conversion material.

By way of example, the layer(s) of first wavelength conversion material(s) may convert all or a portion of incident primary light to output light. Although the output light may include light in various portions of the visible region of the electromagnetic spectrum, the intensity of light at certain portions of that region may be relatively less than others. For example, the output light may contain relatively large amounts of light in the blue portion of the visible region, but relatively small amounts of light in the green, orange, yellow and/or red portions of the visible region. As a result, the color temperature of the output light may be relatively cool, e.g., ranging from about 5000K to about 10000K.

In such instances, the layer(s) of second wavelength conversion material(s) may produce tertiary light with a relatively high intensity of light in the green, orange, yellow and/or red portions of the visible region. In particular, they may be configured to produce additional light in the red portion of the electromagnetic spectrum, so as to "warm up" the output light from a lamp. Non-limiting examples of such materials include yellow-green phosphors such as cerium doped garnets such as $Lu_3Al_5O_{12}:Ce^{3+}$ and $Tb_3Al_5O_{12}:Ce^{3+}$, etc.; red/amber nitrides such as $M_2Si_5N_8:Eu^{2+}$ where M=Ca, Sr, Ba; red/amber oxynitrides such as $MSi_2O_2N_2:Eu^{2+}$ where M=Ca, Sr, Ba; and red/yellow/green emitting silicates such as $BaMgSi_4O_{10}:Eu^{2+}$, and $M_2SiO_4:Eu^{2+}$ wherein M=Ca, Ba, Sr. Without limitation, the materials used to form the layer(s) of second wavelength conversion material(s) is/are preferably different than the materials used to form the layer(s) of first wavelength conversion material(s). Without limitation, the layer(s) of second wavelength conversion material(s) preferably include or are formed of a europium-activated strontium silicon nitride or strontium silicon oxynitride phosphor, such as those identified above.

In some embodiments, the layer(s) of second wavelength conversion material(s) may be configured to produce tertiary light having a color temperature ranging from about 2000K to about 3500K, such as about 2700K to about 3200K. In some embodiments, the tertiary light produced by the layer(s) of at least one second wavelength conversion material is/are configured such that the output light downstream of the converter has a color temperature ranging from about 2500K to about 4000K, such as about 3000K to about 3500K, or even about 3000K.

Like the layer(s) of first wavelength conversion material(s), the thickness of the layer(s) of at least one second wavelength conversion material(s) may impact optical performance. For example, the thickness of the layer(s) of second wavelength conversion material(s) may impact the degree to which such layer(s) may convert primary and/or secondary light to tertiary light. Accordingly, the thickness of the layer(s) of second wavelength conversion material(s) may be selected to achieve desired optical properties. In some embodiments, the thickness of the layer(s) of second wavelength conversion material(s) may range from about 10 nanometers (nm) to about 20 micrometers (μm), such as about 50 nm to about 20 μm, about 500 nm to about 20 μm, or even about 1 μm to about 5 μm.

The particle size of phosphor(s) in the layer(s) of at least one second wavelength conversion material may also impact the optical properties of such layer(s). For example, the particle size of phosphor(s) in the layer(s) of at least one second wavelength conversion material may affect the degree to which such layer(s) scatter incident primary and/or secondary light. Without limitation, the phosphors of the layer(s) of at least one second wavelength conversion material may be deposited so that such layers substantially do not scatter incident primary and/or secondary light. That is, the layer(s) of at least one second wavelength conversion material may be deposited so that they scatter less than or equal to about 5% of incident primary and/or secondary light. Put in other terms, the layer(s) of second conversion material may be deposited so that they do not substantially impede the forward transmission of incident primary and/or secondary light into a subsequent conversion layer.

Accordingly, the phosphor(s) in the layer(s) of second wavelength conversion material(s) may have a particle size that is selected to achieve desired optical properties, such as but not limited to a desired degree of scattering. In some embodiments, the phosphor(s) included in the layer(s) of second wavelength conversion material(s) have a particle size ranging from about 100 nm to about 8 μm, such as about 100 nm to about 1 μm, about 100 nm to about 700 nm, about 100 nm to about 500 nm, or even about 100 to about 450 nm. Without limitation, the particle size of the phosphor(s) of the layer(s) of second wavelength conversion material(s) is less than or equal to the wavelength of incident primary and/or secondary light. Thus, if incident primary light is in a wavelength range of about 450 nm to 500 nm, the particle size of the phosphor(s) of the layer(s) of second wavelength conversion material(s) is preferably less than or equal to about 450 nm, such as about 100 to about 400 nm.

The layer(s) of second wavelength conversion material(s) may be deposited or otherwise formed on a substrate or other support (e.g., on or above a layer of first wavelength conversion material) in any suitable manner. For example, the layer(s) of second wavelength conversion material(s) may be deposited using physical vapor deposition, chemical vapor deposition, sputtering, pulsed laser deposition, electrophoretic deposition or any other deposition technique.

As may be appreciated, at least one second wavelength conversion material may include or be in the form of a green, yellow, or red phosphor that has relatively complex stoichiometry. Due to this stoichiometric complexity, it may be difficult to deposit such phosphors using techniques such as physical vapor deposition, sputtering, and pulsed laser deposition. In the case of sputtering for example, it may be difficult to obtain suitable sputtering targets from which a layer of second wavelength conversion material may be deposited. Physical vapor deposition of the second wavelength conversion material(s) may also be complex and require careful control over numerous feed gases to obtain layers having a desired chemistry. Thus without limitation, the layer(s) of second wavelength conversion material are preferably deposited using electrophoretic deposition.

By way of example, in instances where nitride phosphors are used as the second wavelength conversion material, electrophoretic deposition of such phosphors may occur by introducing nitride phosphor particles into a bath containing a solvent (e.g. isopropyl alcohol or another suitable solvent) that includes dissolved nitrate salts and water. The nitrate salts may dissociate to some degree in the solvent, providing ions which may positively or negatively charge the phosphor particles. Deposition of phosphor particles may proceed by immersing an electrode and a work piece (e.g., a substrate with layer(s) of first wavelength conversion material thereon) in the bath, and applying a voltage to bias electrically the work piece relative to the electrode. For example, where the phosphor particles are positively charged, deposition may occur by negatively biasing the work piece and positively biasing the electrode, thereby driving the positive charged phosphor to the negatively biased work piece.

To facilitate electrophoretic deposition of the layer(s) of second wavelength conversion material(s), one or more conductive layers may be used. When used, the conductive layer(s) may be deposited on all or a portion of the work piece (at this point a portion of a thin film converter). For example, when one or more layer(s) of first wavelength conversion material(s) have been deposited on a first side of a planar substrate, a conductive layer may be deposited on the layer(s) of first wavelength conversion material(s), on a second side of the planar substrate, or a combination thereof. As may be appreciated, the conductive layer may facilitate electrical biasing of the work piece and thus the electrophoretic deposition of the layer(s) of second wavelength conversion material(s).

Any suitable conductive material may be used to form conductive layers consistent with the present disclosure. Examples of such materials include but are not limited to metals (e.g., gold, copper, aluminum, etc.), indium tin oxide (ITO), aluminum-doped zinc oxide (ZnO:Al), gallium-doped zinc oxide, niobium-doped strontium titanium oxide ($SrTiO_3$:Nb), indium gallium zinc oxide (IGZO), doped tin oxide, graphene, lead zirconate titanate (PZT), combinations thereof, and the like. Without limitation, the conductive layers of the present disclosure are preferably transparent and formed of indium tin oxide.

The conductive layers of the present disclosure are preferably configured to transmit desired amounts of primary, secondary, and tertiary light. For example, the conductive layers may be configured to transmit greater than or equal to about 50%, such as greater than or equal to about 60%, 70%, 80%, 90%, 95%, 99% or even 100% of primary, secondary, and tertiary light.

Subsequent to deposition, the layer(s) of second wavelength conversion material(s) may be subject to post processing, including but not limited to thermal post processing such as annealing. The processing parameters suitable for use in thermal post processing the layer(s) of second wavelength conversion material(s) are the same as those specified above for the layer(s) of first wavelength conversion material(s), and for the sake of brevity are not reiterated.

In some embodiments, the layer(s) of second wavelength conversion material(s) may be deposited directly on the surface of a layer of first wavelength conversion material, or directly on a surface of a conductive layer that is present on a surface of a layer of first wavelength conversion material. Accordingly, the thin film wavelength converters may exhibit an S:A:B or S:A:C:B layer structure, wherein S corresponds to a substrate, A corresponds to one or more layers of first wavelength conversion material, B corresponds to one or more layers of second wavelength conversion material, and C corresponds to one or more layers of conductive material. Alternatively or additionally, the thin film wavelength converters may exhibit an A:S:B or A:S:C:B layer structure, wherein A, B, C, and S are defined as above.

In either case, the layers on either or both sides of the substrate may repeat one or more times. Thus for example, the thin film wavelength converters described herein may exhibit an S:A:B:A:B:A:B . . . S:A:C:B:A:C:B . . . A:S:C:B:C:B:C:B layer structure, wherein A, B, C, and S are defined as above.

In some embodiments, the layer(s) of second wavelength conversion material(s) may be processed into a pattern or other structure after deposition. For example, the layer(s) of second wavelength conversion material(s) may be processed into a plurality of phosphor "islands," which may be in contact with a surface of a layer of first wavelength conversion material or a conductive material. In this way, a layer of second conversion material may be processed into "pixels" (e.g., three dimensional islands having a height, width, and gap spacing). Such processing may be performed for example by subjecting a deposited layer of one second wavelength conversion material to an etching process, such as but not limited to photolithography. The manner in which such processing may be performed is the same as that specified above for the layer(s) of first wavelength conversion material(s), and thus is not repeated. By patterning the layer(s) of second wavelength conversion material(s), it may be possible to control the amount of tertiary light that is added to the output light of a light source. As a result, the color temperature of the output light may be controlled by appropriately etching/patterning the layer(s) of second wavelength conversion material(s).

For the sake of illustration, the present disclosure will now proceed to describe exemplary thin film wavelength converters consistent with the present disclosure, as well as exemplary methods for manufacturing the same. It should be understood that such examples are for the sake of illustration only, and that other thin film converter configurations and production methods may be used and are contemplated by the present disclosure.

With the foregoing in mind, reference is now made to FIGS. 2A-2D, which sequentially illustrate the formation of one example of a thin film converter consistent with the present disclosure. The sequential illustration in FIGS. 2A-2D generally coincides with the various operations performed in accordance with FIG. 3, which is a flow diagram depicting operations performed in accordance with one exemplary method of forming a thin film converter consistent with the present disclosure. Accordingly where possible, the operations outlined in FIG. 3 will be described in conjunction with the sequential illustration of FIGS. 2A-2D.

As shown in FIGS. 2A-D, production of a thin film converter 103' consistent with the present disclosure may begin with the provision of a substrate 201. As shown, substrate 201 may be generally planar and may include upper and lower surfaces (not labeled), either of which may support one or more thin films of wavelength conversion material. For the sake of illustration, FIGS. 2A-D sequentially depict the production of thin film converter 103' that includes two layers of wavelength conversion material on its upper (first) surface. It should be understood however that any number of layers of conversion material may be used, and that such conversion layers may be present on either or both of the upper and lower surfaces of substrate 201.

Substrate 201 may be formed of any material that provides a stable structure upon which one or more layers 202 of at least one first wavelength conversion material may be deposited. Suitable materials include those described previously. Without limitation, substrate 201 is preferably a sapphire substrate, which may be planar or non-planar.

Once substrate 201 is provisioned or otherwise made available, production of the thin film converter may proceed (e.g., pursuant to box 302 of FIG. 3) by depositing a layer of first wavelength conversion material 202 on an upper (first) surface of substrate 201. Suitable materials for forming first wavelength conversion material 202 include those identified previously as suitable first wavelength conversion materials. Without limitation, first wavelength conversion material 202 is preferably formed from $Y_3Al_5O_{12}:Ce^{3+}$. While FIGS. 2A-2D depict first wavelength conversion material 202 as a conformal coating, such a structure is not required. Indeed as noted previously, the layer of first wavelength conversion material 202 may be deposited or processed into islands or pixels of first wavelength conversion material, e.g., using photochemical etching and/or a selective deposition process.

Deposition of first wavelength conversion material 202 may be performed using any suitable deposition process, such as those described previously as suitable for depositing first wavelength conversion materials. Without limitation, first wavelength conversion material is preferably deposited on substrate 201 using pulsed laser deposition (PLD) or electrophoretic deposition.

Figure 3:
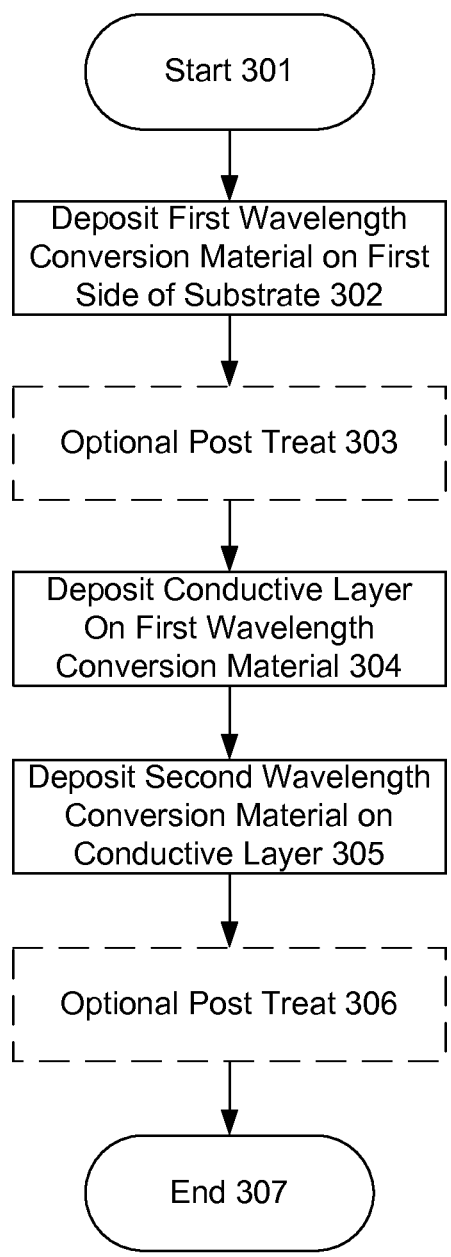
FIG. 3 is a flow diagram illustrating exemplary operations for forming an all inorganic wavelength converter consistent with FIG. 2D.

In some embodiments, first wavelength conversion material 202 may be subjected to one or more post treatment processes (e.g., pursuant to optional block 303 of FIG. 3). For example, the first wavelength conversion material may be subjected to heat treatment, e.g., for grain growth or another purpose. In some embodiments, substrate 201 and first wavelength conversion material 202 are subjected to heat treatment at about 1400 to about 1600° C.

Figure 2A:
FIGS. 2A-2D stepwise illustrate an exemplary process for forming an all inorganic wavelength converter consistent with the present disclosure.
Figure 2B:
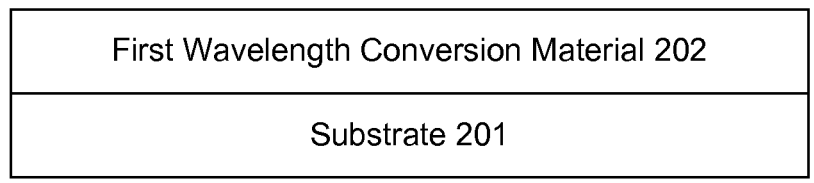
Figure 2C:
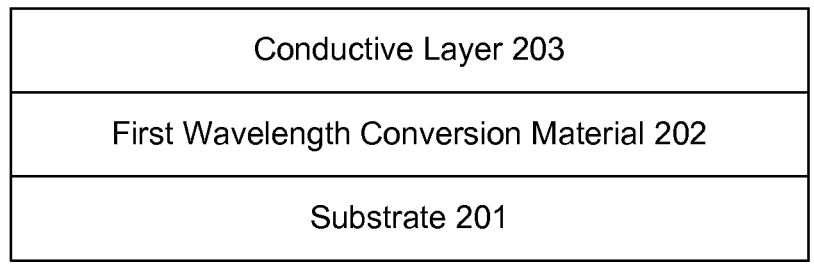
Figure 2D:
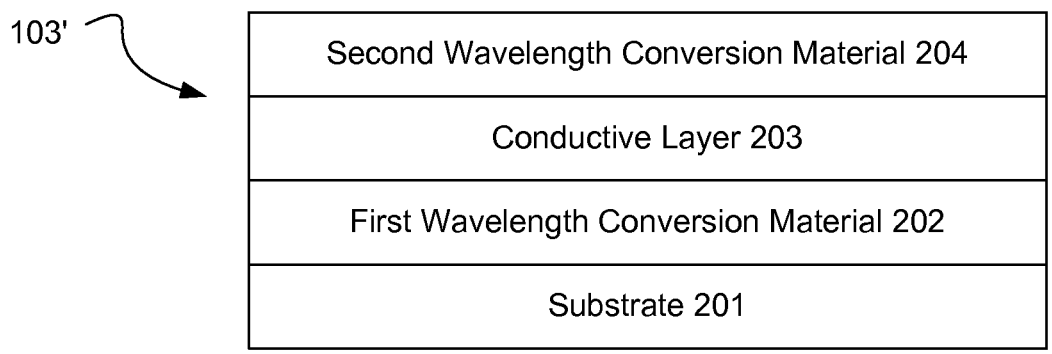

Once first wavelength conversion material 202 is deposited and optionally post treated, production of the thin film converter may proceed (e.g., pursuant to block 304 of FIG. 3) by depositing conductive layer 203 on the exposed surface of first wavelength conversion material 202, as shown in FIG. 2C. Conductive layer 203 may be formed of any suitable conductive material, as previously described. Without limitation, conductive layer 203 is formed from indium tin oxide, graphene, or a combination thereof. In instances where first wavelength conversion material 202 is deposited as a conformal coating, conductive layer 203 may also be deposited as a conformal coating, as shown in FIG. 2C. Alternatively or additionally, conductive layer 203 may be selectively deposited or processed into islands of conductive material, as will be described later in connection with another embodiment of the present disclosure.

Any suitable process may be used to deposit conductive layer 203 on first wavelength conversion material 202. Without limitation, conductive layer 203 is preferably deposited on conversion material 202 using sputtering or another physical deposition technique.

Once conductive layer 203 has been deposited, production of the thin film converter may proceed (e.g., pursuant to block 305 of FIG. 3) by depositing second wavelength conversion material 204 on the exposed (e.g. upper) surface of conductive layer 203. Second wavelength conversion material 204 may be formed from any suitable wavelength conversion material, and preferably includes or is formed of different wavelength conversion materials than first wavelength conversion material 202. Suitable materials for forming second wavelength conversion material 204 include those previously described. Without limitation, second wavelength conversion material 204 is preferably formed from a europium-activated strontium nitride or oxynitride phosphor.

Any suitable deposition technique may be used to deposit second wavelength conversion material 204, as noted previously. Without limitation, second wavelength conversion material 204 is preferably deposited using electrophoretic deposition. Such deposition may be performed for example by immersing the structure shown in FIG. 2C into a bath containing a solvent, one or more salts, and charged particles of second wavelength conversion material, as generally described above.

After second wavelength conversion material 204 has been deposited, it may (pursuant to optional block 306 of FIG. 3) be subject to post processing, e.g. heat treatment, annealing, subsequent coating processes, etc. Once such post processing is complete (or if no post processing is performed), the method may end pursuant to block 307 of FIG. 3.

Reference is now made to FIGS. 4A-4G, which sequentially illustrate the formation of another exemplary a thin film converter consistent with the present disclosure. The sequential illustration in FIGS. 4A-4G generally coincides with various operations performed in accordance with FIG. 5, which is a flow diagram depicting operations performed in accordance with one exemplary method of forming a thin film converter consistent with the present disclosure. Accordingly where possible, the operations outlined in FIG. 5 will be described in conjunction with the sequential illustration of FIGS. 4A-4G.

Figure 4F:
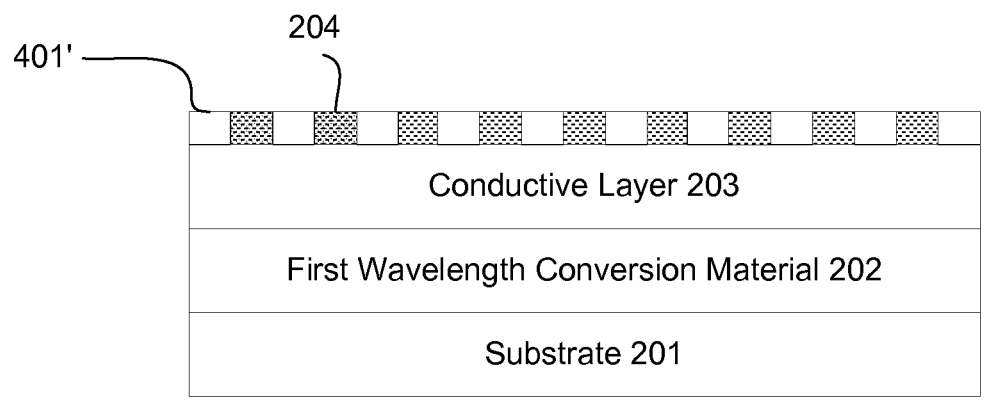
Figure 5:
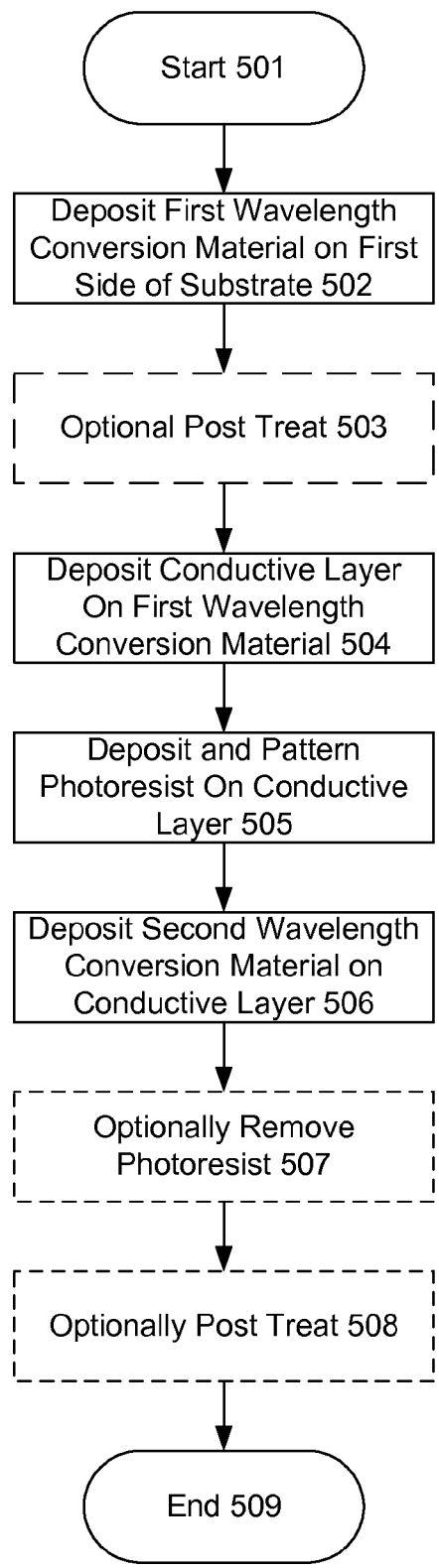
FIG. 5 is a flow diagram illustrating exemplary operations for forming an all inorganic wavelength converter consistent with FIGS. 4A-4G.

As shown in FIGS. 4A-4C and blocks 501-504 of FIG. 5, production of a thin film converter 103" consistent with the present disclosure may begin with the provision of a substrate 201, deposition of first wavelength conversion material 202, and deposition of conductive layer 203. The nature of these layers and the manner in which they are formed is the same as described above in connection with elements 201-203 and blocks 301-304 of FIGS. 2A-2D and 3. Thus for the sake of brevity the nature and production of such elements is not repeated.

Turning now to FIGS. 4D-4E and block 505 of FIG. 5, production of thin film converter 103" may proceed by depositing a layer of photoresist 401, e.g., via dip coating, spraying, or another suitable deposition technique. After photoresist 401 has been deposited, it may be processed to form a patterned photoresist 401', e.g., using photochemical etching, photolithography, or other methods known in the art. As shown in FIG. 4E, patterned photoresist 401' forms a mask that may include islands of photoresist that protect underlying portions of conductive layer 203, while leaving other portions of conductive layer 203 exposed.

At this point, production of thin film converter 103" may proceed (pursuant to block 506 of FIG. 5) by depositing second wavelength conversion material 204 on the exposed portions of conductive layer 203, as shown in FIG. 4F. Consistent with the description of FIGS. 2D and 3, deposition of second wavelength conversion material 204 may be performed in any suitable manner. Without limitation, electrophoretic deposition is preferably used to deposit second wavelength conversion material 204 on the exposed portions of conductive layer 203.

Figure 4G:
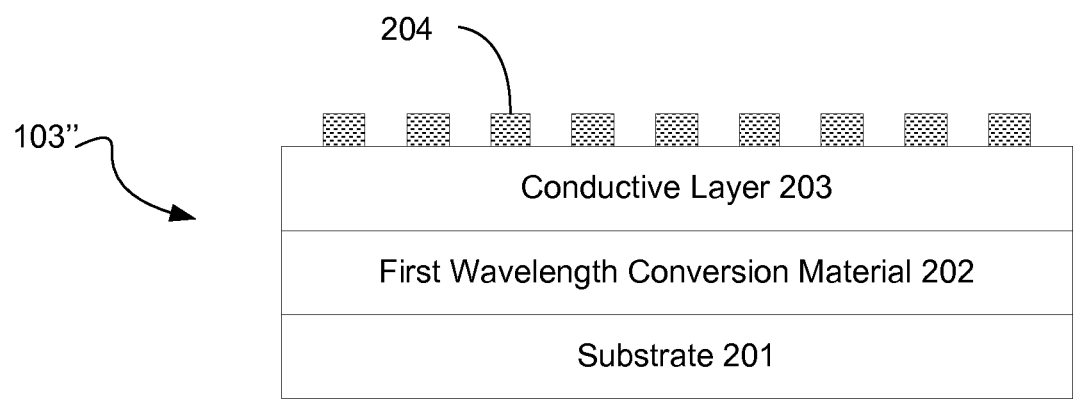

Once second wavelength conversion material 204 has been deposited on the exposed portions of conductive layer 203, production of thin film converter 103" may optionally proceed (e.g., pursuant to optional block 507 of FIG. 5) by removing patterned photoresist 401', leaving islands of second wavelength conversion material 204 on conductive layer 203, as illustrated in FIG. 4G. Before or after removal of patterned photoresist 401', the second wavelength conversion material 204 may be subject to post treatment, such as heat treating, annealing, etc., as generally described above. At block 509, the method ends.

Reference is now made to FIGS. 6A-6D, which sequentially illustrate the production of another exemplary a thin film converter consistent with the present disclosure. The sequential illustration in FIGS. 6A-6D generally coincides with various operations performed in accordance with FIG. 7, which is a flow diagram depicting operations performed in accordance with one exemplary method of forming a thin film converter consistent with the present disclosure. Accordingly where possible, the operations outlined in FIG. 7 will be described in conjunction with the sequential illustration of FIGS. 6A-6D.

Figure 7:
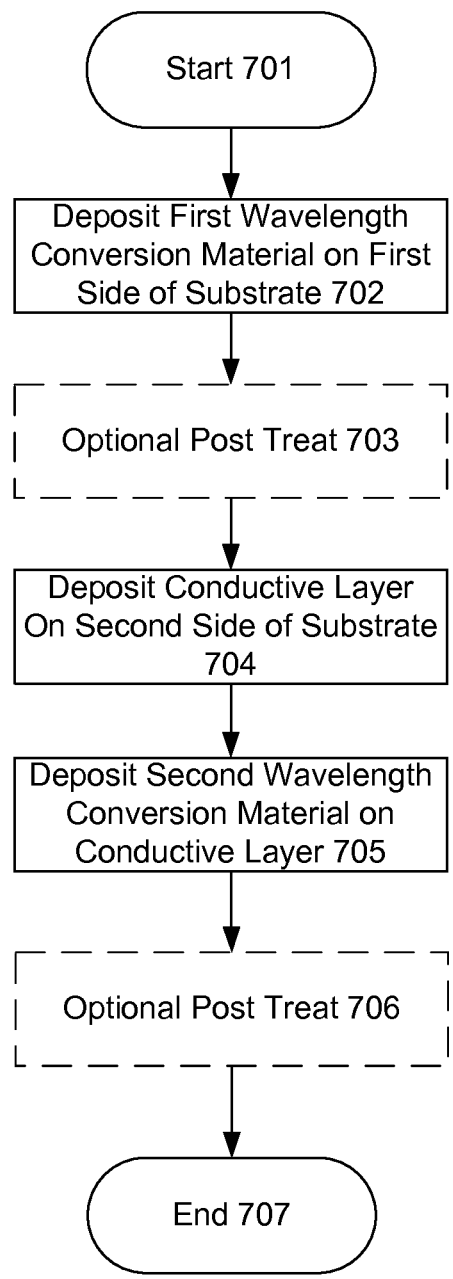
FIG. 7 is a flow diagram illustrating exemplary operations for forming an all inorganic wavelength converter consistent with FIG. 6D.

As shown in FIG. 6A and blocks 701-703 of FIG. 7, production of a thin film converter 103''' consistent with the present disclosure may begin with the provision of a substrate 201 and deposition of first wavelength conversion material 202. These operations are generally the same as those discussed above in connection with elements 201-202 and blocks 301-303 of FIGS. 2A, 2B and 3, except that first wavelength conversion material 202 is deposited on a second (lower) surface of substrate 201, instead of a first (upper) surface of substrate 201. Thus for the sake of brevity the nature and production of such elements is not repeated in detail. In some embodiments, pulsed laser deposition or electrophoretic deposition may be used to form first wavelength conversion material 202 on the second (lower) surface of substrate 201.

Turning now to FIG. 6C and block 704 of FIG. 7, production of thin film converter 103''' may proceed by depositing conductive layer 203 on a first (upper) surface of substrate 201. The nature and deposition of conductive layer 203 is the same as previously described in connected with earlier embodiments, except inasmuch as it is formed on a surface of substrate 201 that is opposite the surface on which first wavelength conversion material 202 was deposited. Accordingly, the nature and production of conductive layer 203 is not reiterated.

As shown in FIG. 6D and pursuant to blocks 705 and 706 of FIG. 7, production of thin film converter 103''' may proceed by depositing second wavelength conversion material 204 on the exposed surface of conductive layer 203. Consistent with prior descriptions, deposition of second wavelength conversion material 204 may be performed in any suitable manner. Without limitation, electrophoretic deposition is preferably used to deposit second wavelength conversion material 204 on the exposed portions of conductive layer 203. The deposited second conversion material 204 may be optionally post-treated (e.g., pursuant to block 706 of FIG. 7). At block 707, the method ends.

Reference is now made to FIGS. 8A-8G, which sequentially illustrate the formation of another exemplary a thin film converter consistent with the present disclosure. The sequential illustration in FIGS. 8A-8G generally coincides with various operations performed in accordance with FIG. 9, which is a flow diagram depicting operations performed in accordance with one exemplary method of forming a thin film converter consistent with the present disclosure. Accordingly where possible, the operations outlined in FIG. 9 will be described in conjunction with the sequential illustration of FIGS. 8A-8G.

Figure 8A:
FIGS. 8A-8G stepwise illustrate another exemplary process for forming another all inorganic wavelength converter consistent with the present disclosure.
Figure 8B:
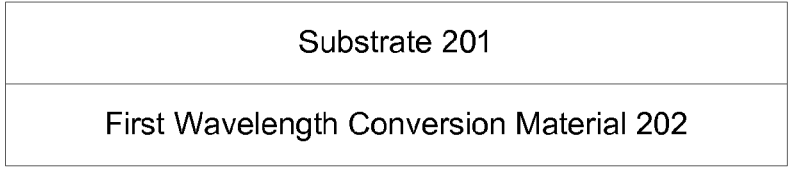
Figure 8C:
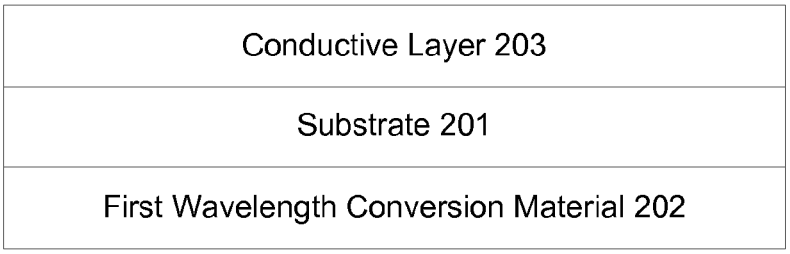
Figure 9:
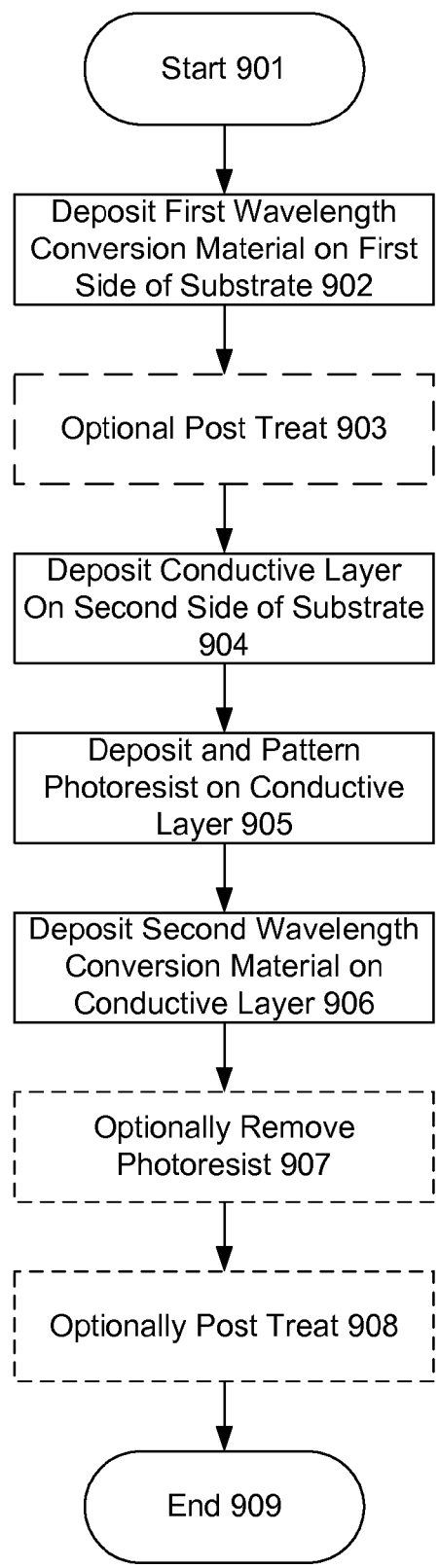
FIG. 9 is a flow diagram illustrating exemplary operations for forming an all inorganic wavelength converter consistent with FIGS. 8A-8G.

As shown in FIGS. 8A-8C and blocks 901-904 of FIG. 9, production of a thin film converter 103'''' consistent with the present disclosure may begin with the provision of a substrate 201, deposition of first wavelength conversion material 202 on a second (lower) surface of substrate 201, and deposition of conductive layer 203 on a first (upper) surface of substrate 101. The nature of these layers and the manner in which they are formed is the same as described above in connection with elements 201-203 and blocks 701-704 of FIGS. 6A-6C and 7. Thus for the sake of brevity the nature and production of such elements is not repeated.

Figure 8D:
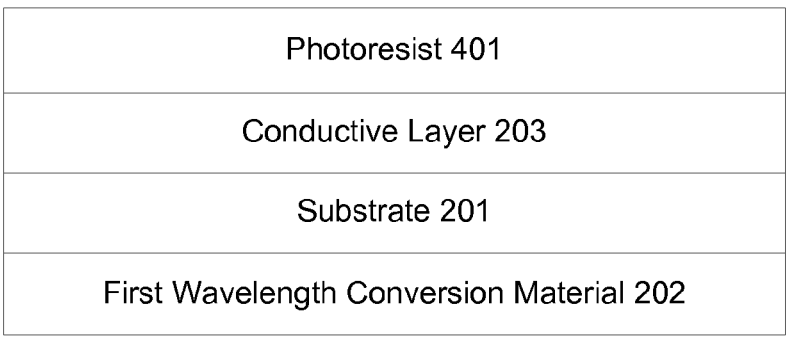
Figure 8E:
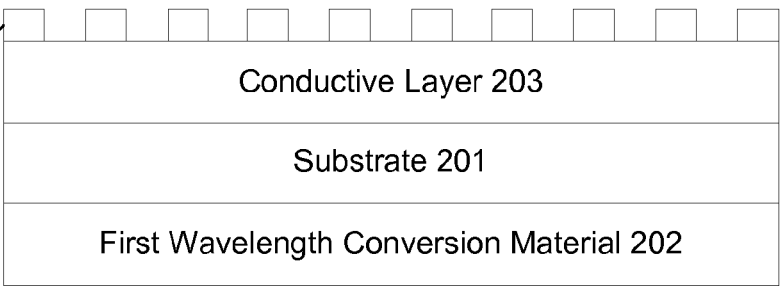

Turning now to FIGS. 8D-8E and block 905 of FIG. 9, production of thin film converter 103'''' may proceed by depositing a layer of photoresist 401, e.g., via dip coating, spraying, or another suitable deposition technique. After photoresist 401 has been deposited, it may be processed to form a patterned photoresist 401', e.g., using photochemical etching, photolithography, or other methods known in the art. As shown in FIG. 8E, patterned photoresist 401' forms a mask that may include islands of photoresist that protect underlying portions of conductive layer 203, while leaving other portions of conductive layer 203 exposed.

Figure 8F:
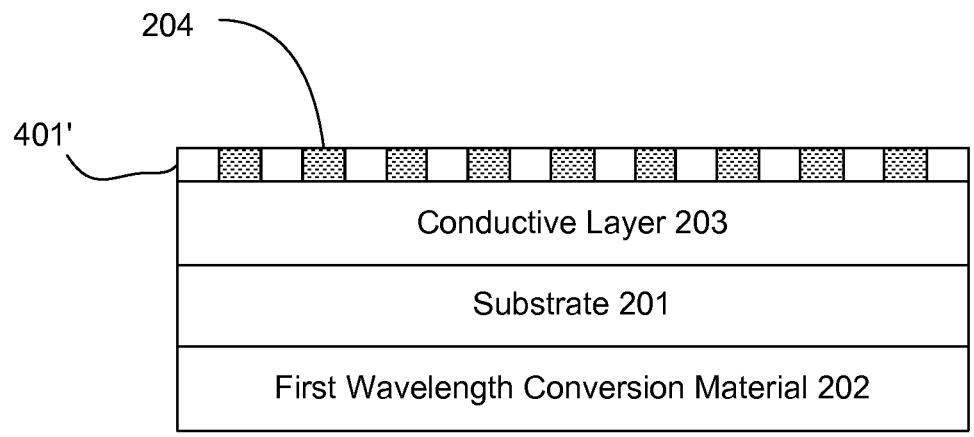
Figure 8G:
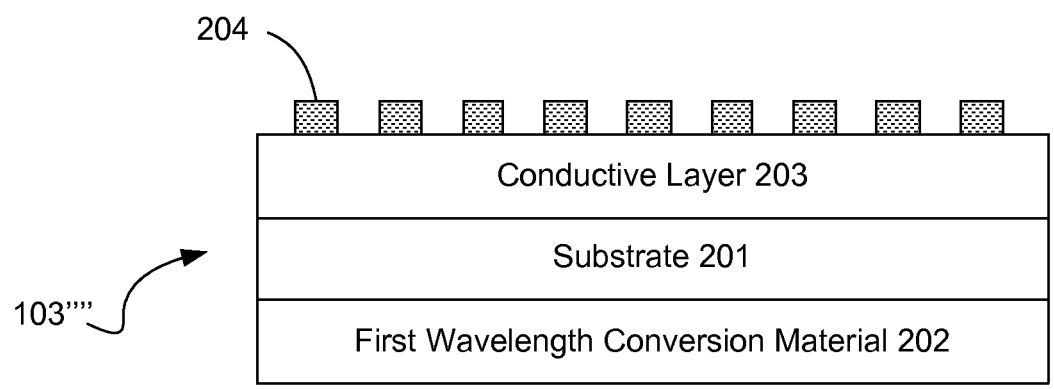

At this point, production of thin film converter 103'''' may proceed (pursuant to block 906 of FIG. 9) by depositing second wavelength conversion material 204 on the exposed portions of conductive layer 203, as shown in FIG. 8F. Consistent with prior descriptions of, the deposition of second wavelength conversion material 204 may be performed in any suitable manner. Without limitation, electrophoretic deposition is preferably used to deposit second wavelength conversion material 204 on the exposed portions of conductive layer 203.

Once second wavelength conversion material 204 has been deposited on the exposed portions of conductive layer 203, production of thin film converter 103'''' may optionally proceed (e.g., pursuant to optional block 907 of FIG. 9) by removing patterned photoresist 401', leaving islands of second wavelength conversion material 204 on conductive layer 203, as illustrated in FIG. 8F. Before or after removal of patterned photoresist 401', the second wavelength conversion material 204 may be subject to post treatment, such as heat treating, annealing, etc., as generally described above. At block 909, the method ends.

While FIGS. 2A-9 describe the formation of wavelength converters in which one or more phosphor layers and conductive layers are deposited on a substrate 201, it should be understood that the use of substrate 201 is not required. Indeed, in the embodiments of FIGS. 2A-8G, substrate 201 may be omitted and first wavelength conversion material 202 may be utilized as a substrate for the subsequent deposition of conductive layer(s), second wavelength conversion material layer(s), and photoresist layer(s) (where applicable).

The following examples describe thin film converters consistent with the present disclosure, and are for the sake of illustration only.

Example 1

First Wavelength Conversion Material Deposition

Thin films of YAG:Ce were grown on c-sapphire, r-sapphire, quartz, and phosphor ceramic substrates. The YAG:Ce films were deposited using PLD in an oxygen atmosphere at 3 mTorr. The laser pulse repetition rate was varied from 5 to 50 Hertz (Hz). The substrate temperature during deposition varied from room temperature to about 1000° C. After deposition, the samples were annealed with a belt furnace at temperatures ranging from 1400-1600° C. in a $H_2$—$N_2$ atmosphere.

Example 2

Conductive Layer Deposition

Conductive layers were deposited on the samples produced pursuant to example 1. In particular, RF sputtering was performed using a KJ Lesker 2" sputtering gun to produce thin conductive films of indium tin oxide (ITO) on the samples. Prior to sputtering, the samples were cleaned in an ultrasonic bath of acetone-isopropanol. A 2-inch ITO target (10 weight % $SnO_2$) was used for the deposition. The base pressure of the system was $1 \times 10^{-7}$ Torr. ITO sputtering was performed in an argon-oxygen atmosphere at a pressure of 5-20 mTorr. The applied RF power varied from 50-200 W. Sputtering was performed at about 400° C. for about 10 minutes, and resulted in the production of 300 nm thick ITO layers on the samples of example 1. After deposition, the samples were annealed at 400° C. in an oxygen atmosphere for about 2 hours.

Example 3

Second Wavelength Conversion Material Deposition

Layers of second wavelength conversion material ($M_2Si_5N_8:Eu^{2+}$, where M=Ca, Sr, Ba), were deposited on the conductive layers of the samples produced pursuant to example 2. In particular, electrophoretic deposition was used to deposit a $Sr_2Si_5N_8:Eu^{2+}$ phosphor on the conductive layers of the samples made pursuant to example 2. The electrophoretic deposition was performed using a suspension bath containing the nitride phosphor particles, isopropyl alcohol, dissolved nitrate salts, and water. The nitrate salts dissociated slightly to provide ions which charged the nitride phosphor particles. An electrode and the samples of example 2 were immersed in the bath. A voltage of about 10V to 800V was applied across the electrode and the conductive layers of the samples of example 2 so as to adhere the charged nitride particles to the surface of the conductive layers. The deposition time varied from 5 seconds to 100 seconds, with greater time resulting in greater thickness up to about 20 μm.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A thin film wavelength converter, comprising:
   a substrate;
   a first thin film layer, said first thin film layer comprising at least one first wavelength conversion material;
   an electrically conductive layer; and
   a second thin film layer deposited on said electrically conductive layer, said second thin film layer comprising at least one second wavelength conversion material;
   wherein:
   said first thin film layer is configured to convert incident primary light from a light source in a first wavelength range to secondary light in a second wavelength range; and
   said second thin film layer is configured to convert at least one of said primary light and said secondary light to tertiary light in a third wavelength range, said second wavelength range being different from said third wavelength range; and wherein the first thin film layer has a thickness ranging from about 10 nanometers (nm) to about 20 micrometers (μm).

2. The thin film wavelength converter of claim 1, wherein said first wavelength conversion material is selected from the group consisting of garnet phosphors, oxynitride phosphors, nitride phosphors, silicate phosphors, and combinations thereof.

3. The thin film wavelength converter of claim 1, wherein the at least one second wavelength conversion material is chosen from $Y_3Al_5O_{12}:Ce^{3+}$, $Lu_3Al_5O_{12}:Ce^{3+}$, $Tb_3Al_5O_{12}:Ce^{3+}$, $M_2Si_5N_8:Eu^{2+}$ $MSi_2O_2N_2:Eu^{2+}$, $BaMgSi_4O_{10}:Eu^{2+}$, $M_2SiO_4:Eu^{2+}$, $MAlSiN_3:Eu^{2+}$ and combinations thereof, wherein M is chosen from calcium, barium, strontium, and combinations thereof.

4. The thin film wavelength converter of claim 1, wherein said second thin film layer comprises islands of said at least of second wavelength conversion material on said conductive layer.

5. The thin film wavelength converter of claim 1, wherein said substrate comprises an upper and lower surface and said first thin film layer is deposited on the upper surface and the conductive layer is deposited on the first thin film layer.

6. The thin film wavelength converter of claim 1, wherein said substrate comprises an upper and lower surface and said first thin film layer is deposited on the lower surface and the conductive layer is deposited on the upper surface.

7. The thin film wavelength converter of claim 1, wherein said substrate is formed from a material selected from the group consisting of sapphire, at least one phosphor ceramic, polycrystalline transparent alumina, aluminum nitride, yttria stabilized zirconia (YSZ), zirconium oxides, gallium nitride, aluminum gallium nitride (AlGaN), and indium gallium nitride (InGaN).

8. The thin film wavelength converter of claim 1, wherein said conductive layer is comprised of at least one of: a metal film, indium tin oxide (ITO), aluminum-doped zinc oxide (ZnO:Al), gallium-doped zinc oxide, niobium-doped strontium titanium oxide ($SrTiO_3:Nb$), indium gallium zinc oxide (IGZO).

* * * * *